(12) United States Patent
Miller et al.

(10) Patent No.: US 7,435,661 B2
(45) Date of Patent: Oct. 14, 2008

(54) POLISH STOP AND SEALING LAYER FOR MANUFACTURE OF SEMICONDUCTOR DEVICES WITH DEEP TRENCH ISOLATION

(75) Inventors: Gayle Miller, Colorado Springs, CO (US); Eric Brown, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 119 days.

(21) Appl. No.: 11/341,010

(22) Filed: Jan. 27, 2006

(65) Prior Publication Data

US 2007/0178660 A1    Aug. 2, 2007

(51) Int. Cl.
*H01L 21/473* (2006.01)

(52) U.S. Cl. .............................. 438/424; 257/E21.546; 257/524

(58) Field of Classification Search ................ 438/424, 438/425, 426
See application file for complete search history.

(56) References Cited

U.S. PATENT DOCUMENTS

| | | | |
|---|---|---|---|
| 5,943,578 A * | 8/1999 | Katakabe et al. ............ | 438/359 |
| 6,146,970 A | 11/2000 | Witek et al. ................. | 438/424 |
| 6,403,492 B1 | 6/2002 | Buynoski et al. ............ | 438/712 |
| 6,410,403 B1 * | 6/2002 | Wu ............................ | 438/424 |
| 6,579,801 B1 | 6/2003 | Dakshina-Murthy et al. ..... | 438/700 |
| 6,930,027 B2 * | 8/2005 | Parthasarathy et al. ...... | 438/524 |
| 7,189,628 B1 * | 3/2007 | Mirbedini et al. ........... | 438/424 |
| 2005/0064678 A1 * | 3/2005 | Dudek et al. ................ | 438/424 |
| 2005/0176214 A1 * | 8/2005 | Chang et al. ................ | 438/424 |
| 2005/0287765 A1 * | 12/2005 | Onai et al. .................. | 438/438 |
| 2006/0051932 A1 * | 3/2006 | Yoneda ....................... | 438/424 |

OTHER PUBLICATIONS

Wolf and Tauber, Silicon Processing for the VLSI Era: vol. 1—Process Technology 2nd Edition, 2000, pp. 202-206.*

* cited by examiner

*Primary Examiner*—David Vu
*Assistant Examiner*—Earl N Taylor
(74) *Attorney, Agent, or Firm*—Schwegman, Lundberg & Woessner, P.A.

(57) ABSTRACT

A method and resulting device that eliminates vertical steps or gaps in a deep trench isolation region and, thus, eliminates or drastically reduces a possibility of polysilicon stringers. Additionally, the invention allows an inexpensive dielectric material, for example a lower-quality silicon dioxide to be used to fill the deep trench and a higher quality oxide, in an electrically active region, to be used on an uppermost portion of the deep trench without affecting device performance or increasing a possibility of forming polysilicon stringers.

25 Claims, 8 Drawing Sheets

POLISH STOP AND SEALING LAYER FOR MANUFACTURE OF SEMICONDUCTOR DEVICES WITH DEEP TRENCH ISOLATION

TECHNICAL FIELD

The present invention relates to semiconductor processing. More specifically, the invention is a fabrication method for deep trench isolation and a resulting integrated circuit structure.

BACKGROUND ART

To form a semiconductor device, a multitude of elements are formed on or near a surface layer of a semiconductor substrate and electrically connected with each other through conductive lines. Accordingly, there is need for each element formed in a narrow region on the substrate to be electrically isolated from adjacent elements such that the elements are not electrically influenced by each other. For this, in the semiconductor device, an isolation layer or isolation structure is commonly used.

However, as the degree to which semiconductor devices are integrated continues to increase and a size of the various elements is minimized to reduce a distance between the elements or increase a density of the elements, it becomes increasingly difficult to exclude inter-element interference.

To solve the aforementioned problems, a fabrication technique has been developed that uses an SOI substrate in which a buried oxide layer is formed below the device elements. Particularly, in a high performance semiconductor device such as a central processing unit (CPU), the SOI type semiconductor device in which an element region is completely isolated by an insulation layer is widely used. Deep trench isolation techniques are frequently employed to isolate device elements laterally.

Formation of deep trench isolation can be partially accomplished with low-cost dielectric films. Low-cost dielectric films typically have less desirable electrical characteristics (e.g., dielectric breakdown strength or higher shrinkage values) than a high-quality film. However, due to their increased cost (either in terms of material used for their production and/or processing techniques required for their formation and deposition), high-quality films are unsuitable for filling the deep trench.

A high-quality dielectric film is a better choice for filling shallow trench isolation (STI) regions and for producing cap layers over a deep trench fill layer. However, when both types of fill are present in a structure, only one film, preferably the high-quality film, should be exposed at the surface. If both film types are exposed, one of the two films will likely have a higher etch rate during subsequent cleaning and etching processes.

With a differential etch rate, vertical steps typically appear. The vertical steps frequently cause polysilicon stringers to form during a subsequent polysilicon deposition process step. Polysilicon stringers are thin "strings" of polysilicon left along any steps or gaps on an uppermost surface topography of the substrate after etching operations. These stringers occur because the thickness of the polysilicon film is much thicker at a step or gap than in flat areas, by approximately the step height plus the polysilicon thickness. Overetching the polysilicon film to eliminate stringers is undesirable since (1) increased costs result from added or prolonged fabrication steps or operations; and (2) required conductive features may also be etched away. The polysilicon stringers can result in electrical shorts between adjacent polysilicon conductors on a surface of the composite dielectric film. The electrical shorts can produce catastrophic failures in one or more active devices on an integrated circuit (IC) chip, consequently leading to low fabrication yield.

SUMMARY

The present invention is a method and resulting device that eliminates vertical steps or gaps in a deep trench isolation region and, thus, eliminates or drastically reduces a possibility of polysilicon stringers. Additionally, the invention allows an inexpensive dielectric material, for example a lower-quality silicon dioxide to be used to fill the deep trench and a higher quality oxide, in an electrically active region, to be used on an uppermost portion of the deep trench without either affecting device performance or increasing a possibility of forming polysilicon stringers.

Specifically, an exemplary embodiment of the invention is a method of fabricating an electrical isolation device and includes forming a first silicon dioxide layer on a first surface of a substrate, forming a first silicon nitride layer over the first silicon dioxide layer, and etching through a portion of the first silicon dioxide layer and the first silicon nitride layer, thereby exposing a portion of the first surface of the substrate. A shallow trench is then etched into the substrate in a region substantially circumscribed by the exposed portion of the first surface of the substrate. Exposed sidewalls and a bottom region of the shallow trench are then oxidized, forming a liner oxide. A second silicon dioxide layer is conformally deposited, filling the shallow trench and covering at least a portion of the first silicon nitride layer. The second silicon dioxide layer is planarized (e.g., by chemical mechanical planarization (CMP)) to a level substantially coplanar with an uppermost surface of the first silicon nitride layer. A second silicon nitride layer is then deposited over the planarized second silicon dioxide layer. The second silicon nitride layer and the second silicon dioxide layer are etched, exposing a region substantially circumscribed laterally by the shallow trench and a deep trench is etched in the exposed region. A third silicon dioxide layer fills the deep trench and covers at least a portion of the second silicon nitride layer. The third silicon dioxide layer is then planarized (e.g., by CMP) to a level substantially coplanar with an uppermost portion of the second silicon nitride layer. The third silicon dioxide layer, in a region substantially circumscribed laterally by the deep trench, is partially etched into a concave region. The concave region is filled with a fourth silicon dioxide layer. The fourth silicon dioxide layer may be comprised of a material having better electrical performance characteristics than material comprising the third silicon dioxide, or fill layer. Any remaining silicon nitride is then stripped.

Notice that the third and fourth silicon dioxide layers may be different types of oxide with third oxide (i.e., the deep trench fill oxide) being of a lower quality than the fourth silicon dioxide layer (i.e., the layer in closest proximity to an active device region). Overall fabrication costs are thereby reduced without sacrificing the electrical performance of the active device. A region of the second silicon nitride layer overlaying the first silicon dioxide layer and the first silicon nitride layer prevents any gaps or vertical steps from forming.

With this method, an uppermost portion of exposed planarized second oxide layer and the fourth oxide fill layer are continuous; there are no gaps between the two oxide regions. Further processing after this point, for example, polysilicon deposition steps to form active devices (e.g., MOSFETs) is simplified since underlying layers have no inaccessible vertical steps or gaps.

DETAILED DESCRIPTION

Figure 1A:
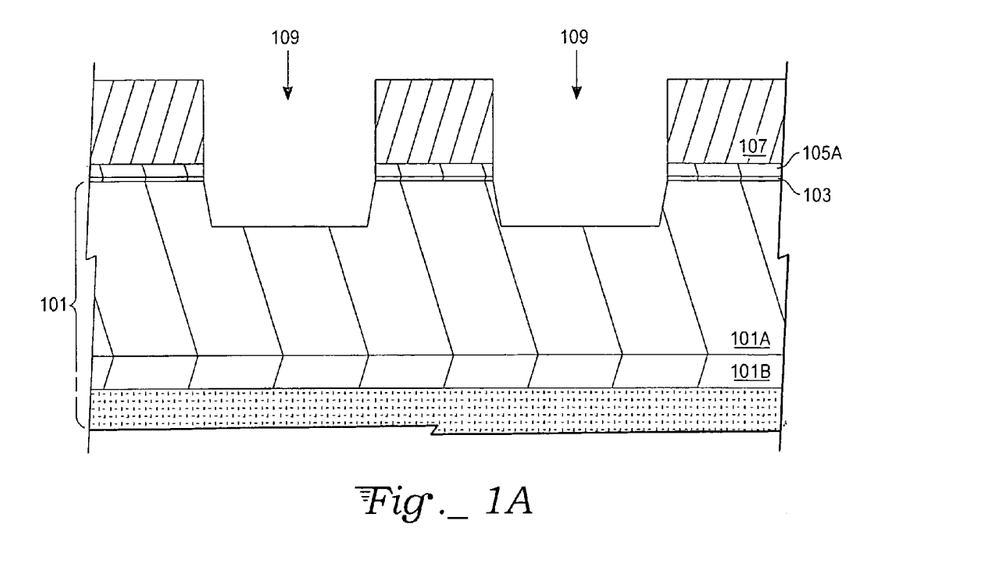
FIGS. 1A-1M show various exemplary fabrication steps for producing a deep trench isolation structure of the present invention.

With reference to FIG. 1A, early exemplary fabrication steps of a deep trench isolation structure begin with a base substrate 101. In a specific exemplary embodiment, the base substrate 101 is a C-flat, silicon on insulator (SOI) over silicon substrate. In the specific exemplary embodiment, the silicon cap layer 101A is approximately 2 μm (2000 nm) in thickness and is bonded to an SOI insulator layer 101B. In other embodiments, the base substrate 101 may be a silicon wafer. Alternatively, another elemental group IV semiconductor or compound semiconductor (e.g., group III-V) may be selected for the base substrate 101. In a case where the base substrate 101 is a semiconductor wafer, the wafer may contain a buried oxide layer (not shown) placed below a polysilicon layer (not shown) to prevent transport of carriers through the underlying bulk semiconducting material. The polysilicon is then treated at an elevated temperature to reform crystalline (i.e., non-amorphous) silicon. In still another embodiment, the base substrate 101 is formed from intrinsic silicon, thereby effectively limiting transport of carriers due to the high resistivity of intrinsic silicon.

A first surface of the base substrate 101 includes a pad oxide layer 103, a first silicon nitride layer 105A, and a first photoresist layer 107. The first photoresist layer 107 is patterned, baked, developed, and etched in accordance with techniques well known to a skilled artisan. Portions of the underlying pad oxide layer 103 and the first silicon nitride layer 105A are then etched, exposing the first surface of the base substrate 101. Etching may be accomplished through various wet etch (e.g., in hydrofluoric acid, such as contained in a standard buffered oxide etch (BOE), or orthophosphoric acid) or dry etch (e.g., reactive-ion etch (RIE)) techniques.

The shallow trenches 109 are etched, in situ, as a follow-on dry etch step once the first silicon nitride layer 105A and the pad oxide layer 103 have been opened. Any silicon-containing layers may be etched, for example, with potassium hydroxide (KOH) or tetra-methyl ammonium hydroxide (TMAH). An edge wall angle of the shallow trench 109 formed within the base substrate 101 will depend on several factors such as a crystallographic orientation of the base substrate 101 and the type of etchant employed. The edge wall angle may be determined by the dry etch process chemistry and conditions used during the shallow trench etch step.

In a specific exemplary embodiment, the first photoresist layer 107 is 8500 Å (0.85 μm), the first silicon nitride layer 105A is 1000 Å (0.1 μm), and the pad oxide is a thermally grown silicon dioxide layer 180 Å in thickness. The SOI silicon cap layer 101A is etched to a depth of 5000 Å (0.5 μm).

Figure 1B:
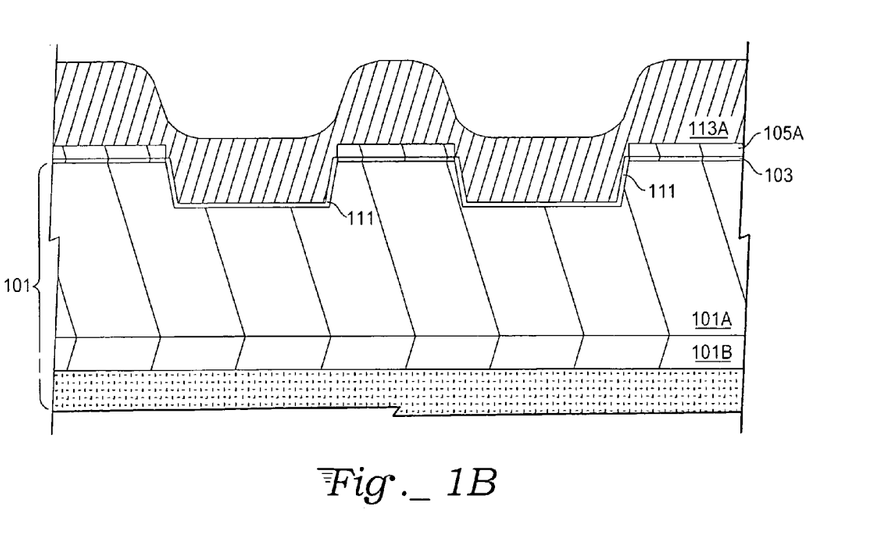

In FIG. 1B, a first liner oxide 111 is thermally grown on sidewalls of the shallow trench 109. In a case of a silicon base substrate 101, mechanisms for thermal silicon dioxide growth apply and are well understood with 44% of the underlying silicon being consumed to form the first liner oxide 111. Alternatively, the first liner oxide 111 could be deposited. A first oxide fill layer 113A is then conformally deposited. The first oxide fill layer 113A may be deposited by any of a variety of techniques such as chemical vapor deposition (CVD), low-pressure CVD (LPCVD), plasma-enhanced CVD (PECVD), or plasma-assisted CVD (PACVD). In a specific exemplary embodiment, the first liner oxide 111 is 520 Å thick and the first oxide fill layer 113A is a high density plasma (HDP) deposition, 7000 Å (0.7 μm) in thickness.

Figure 1C:
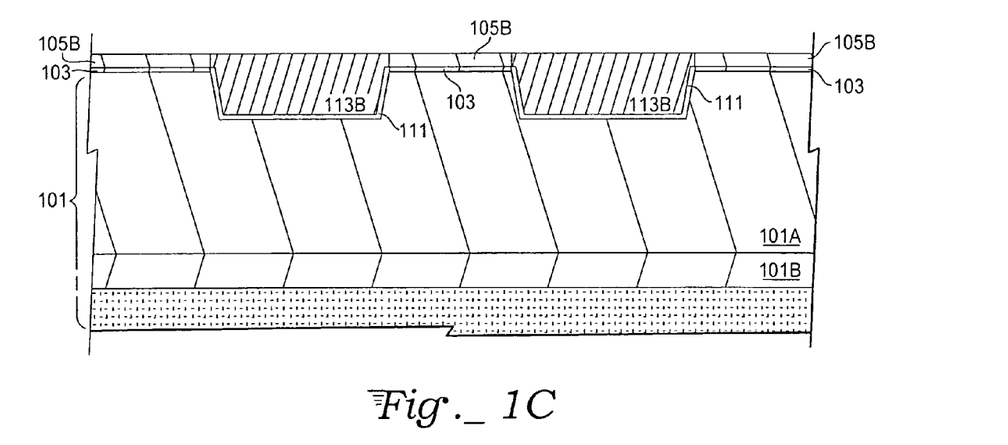

In FIG. 1C, a chemical-mechanical planarization (CMP) step removes a portion of the first oxide fill layer 113A, producing a planarized first oxide layer 113B, to a level essentially coplanar with a top portion of a planarized first nitride layer 105B. In a specific exemplary embodiment, approximately 10% of the first silicon nitride layer 105A is consumed by polishing, resulting in a thickness of the planarized silicon nitride layer 105B being about 900 Å.

Figure 1D:
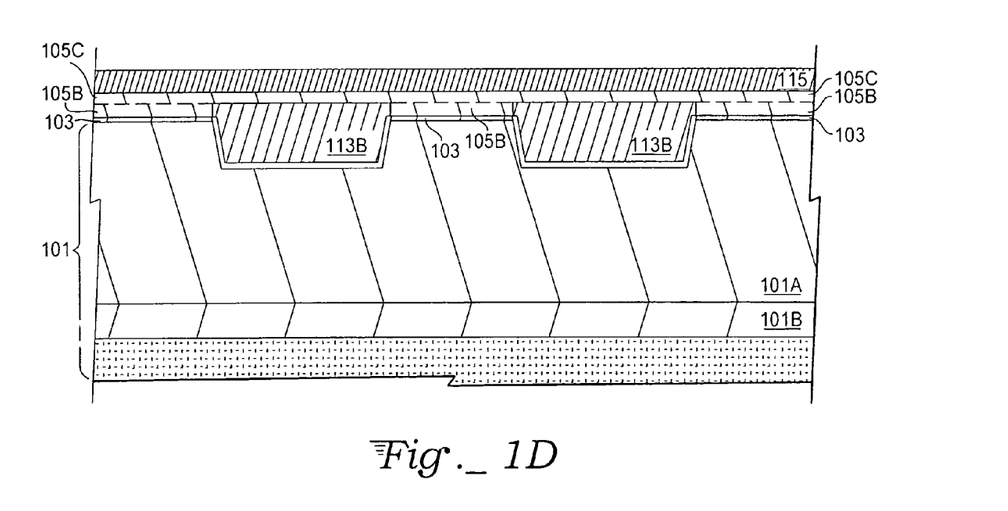

A second silicon nitride layer 105C is then conformally deposited (FIG. 1D), followed by deposition of a second oxide layer 115. In a specific exemplary embodiment, the second silicon nitride layer 105C is about 500 Å in thickness and the second oxide layer 115 is an HDP deposition, approximately 2000 Å in thickness.

Figure 1E:
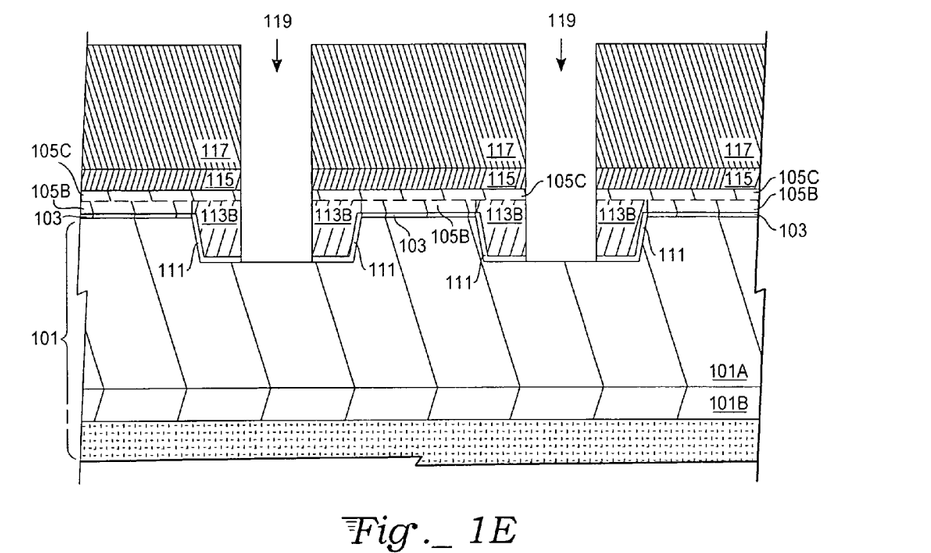
Figure 1F:
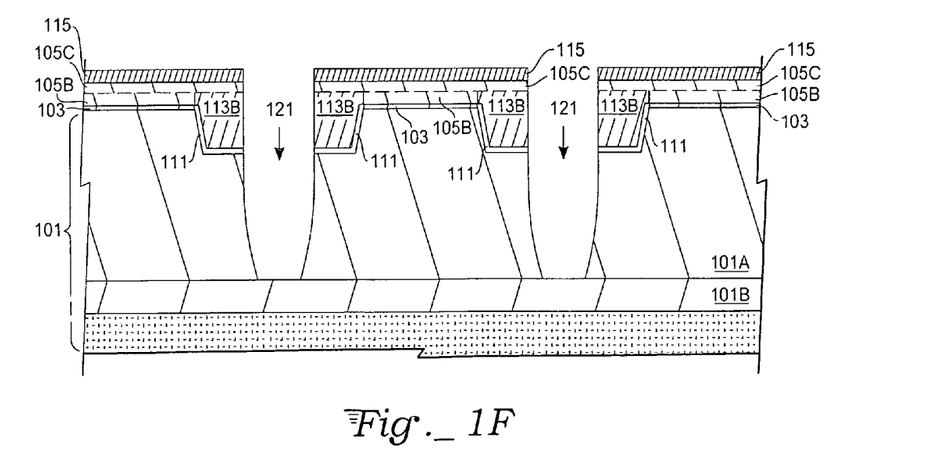

A second photoresist layer 117 is applied (FIG. 1E), patterned, developed, and etched. Portions of the underlying second oxide layer 115, the second silicon nitride layer 105C, the planarized first oxide layer 113B, and the first liner oxide 111 are all etched, exposing a portion of the base substrate 101 and producing a dielectric trench etch window 119. The second photoresist layer 117 is then stripped (FIG. 1F) and the base substrate 101 is etched, producing a deep trench etch 121. If the base substrate 101 is SOI over silicon, the silicon cap layer 101A is etched through to the SOI insulator 101B. If the base substrate 101 is a bulk semiconductor, the deep trench 121 is etched to a depth of several micrometers. (The final device type being fabricated would be determinative of an exact depth required to provide effective electrical isolation.) The base substrate 101 may be wet-etched or dry-etched to form the deep trench 121. In a specific exemplary embodiment, the deep trench etch 121 is produced by RIE and is approximately 0.9 μm in width. The second oxide layer 115 provides an etch stop protecting the second silicon nitride layer 105C.

Figure 1G:
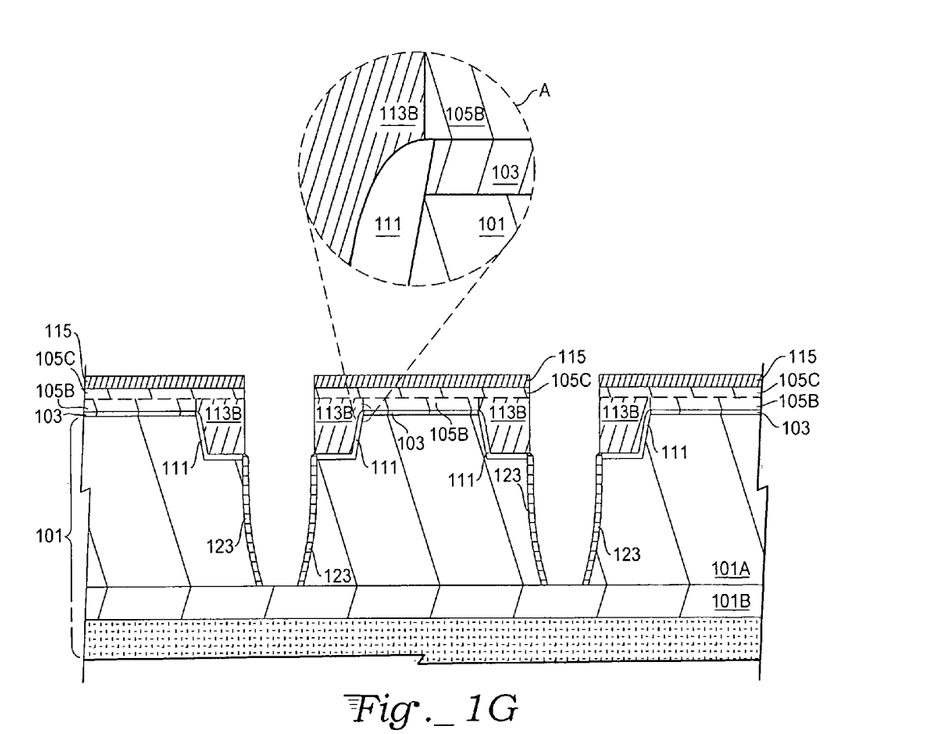

With reference to FIG. 1G, the deep trench etch 121 is oxidized, producing a second liner oxide 123 comprised of, for example, silicon dioxide assuming a silicon-containing base substrate 101. The silicon nitride layers 105B, 105C provides an effective seal against diffusion of any oxidizing species (e.g., oxygen atoms (O) from steam (i.e., $H_2O$) hydration or oxygen molecules ($O_2$) from dry-ox techniques) to portions of the base substrate which may, for example, serve as a channel region of a MOSFET device. An enlarged area "A" of FIG. 1G indicates a sharp, non-oxidized corner region of an active channel. Any oxidation of the channel region can degrade active device (e.g., MOSFET) performance and properties by reducing an effective channel width. A reduced channel width also reduces drive current. Oxidative encroachment is thus prevented by the silicon nitride layers 105B, 105C. The second liner oxide 123 provides a high quality oxide for enhanced device performance. In a specific exemplary embodiment, the second liner oxide 123 is thermally grown to approximately 520 Å in thickness.

Figure 1H:
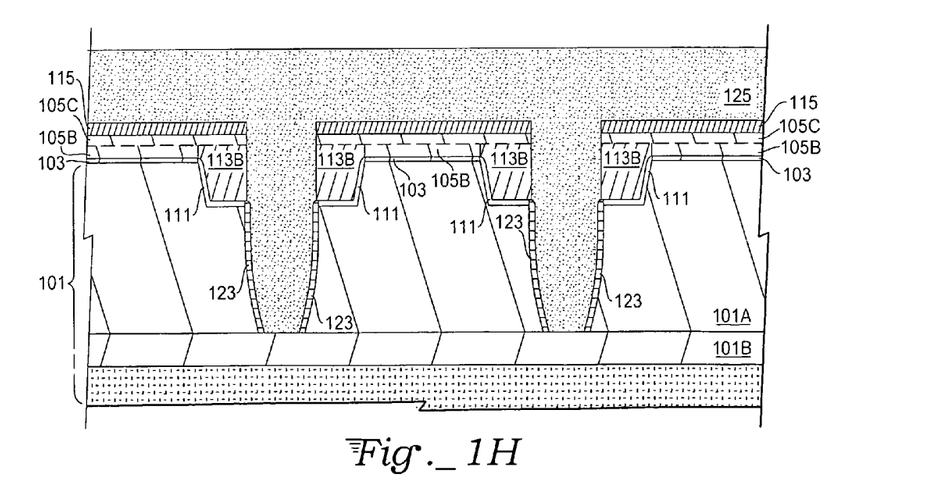
Figure 1I:
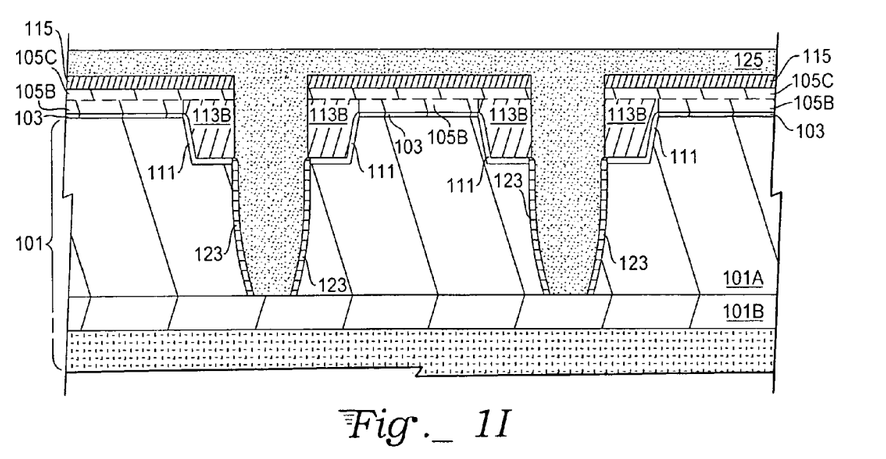

In FIG. 1H, a deep trench oxide fill layer 125 provides a dielectric fill of the deep trench 121. An LPTEOS (low pressure tetra-ethoxysilane) deposition provides a deep fill that has good tensile performance and resists cracking; although a skilled artisan realizes that other low shrinkage dielectric fills and techniques could readily be used (e.g., PETEOS, ozone-TEOS, or an LPCVD oxide). Overfill from the deep trench 121 fill operation is at least partially removed in a densification process (FIG. 1I). Optionally, a second CMP operation may be employed.

Figure 1J:
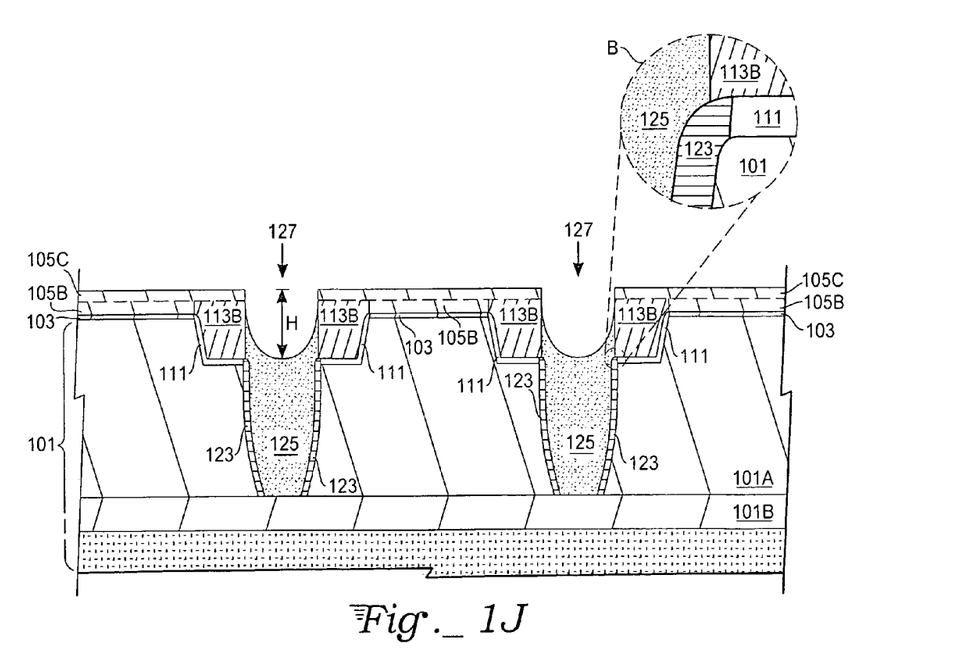

With reference to FIG. 1J, a portion of the densified deep trench oxide fill layer 125 and second oxide layer 115 overlying the second silicon nitride layer 105C has been stripped while concurrently fabricated, selectively-etched shallow trenches 127 have been formed. A high selectivity etchant is used to etch portions of the deep trench oxide fill layer 125 while etching little, if any, of the second silicon nitride layer 105C. Such high-selectivity etchants are well known in the semiconductor art. Generally, a high selectivity to either silicon or silicon dioxide is accomplished using $CHF_3/O_2$, $CH_2F_2$, or $CH_3F$. Undercut on the planarized first oxide layer 113B is minimal. The minimal undercut is readily controlled by a combination of chemical, timing, and application choices which are known to a skilled artisan.

An enlarged area "B" of FIG. 1J shows a portion indicating controlled corner-oxidation is possible in a corner of the substrate 101 near the deep trench oxide fill layer 125. A break, or rounding, of the corner reduces a maximum electric field in this region during high voltage operations. Reducing the electric field strength raises a maximum voltage that can be applied without causing damage to surrounding dielectric materials or degrading dielectric material properties. Further, a large field in this area may lead to carrier trapping, resulting in potential channel inversion regions and potential device leakage. Thus, as design rules for high voltage devices are scaled downward, benefits of corner rounding are becoming increasingly significant. In a specific exemplary embodiment, a height "H" of the shallow trench 127 is approximately 0.2 µm-0.7 µm, although a skilled artisan will recognize the value of "H" will scale with changes in design rules. Additionally, controlling the depth of "H" allows a designer to control an amount of corner rounding required as a function of both design rule and applied maximum voltage.

Figure 1K:
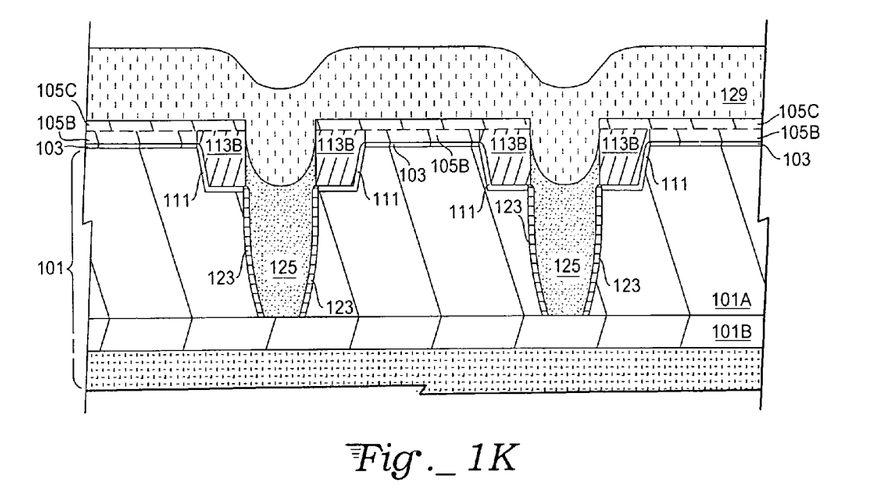
Figure 1L:
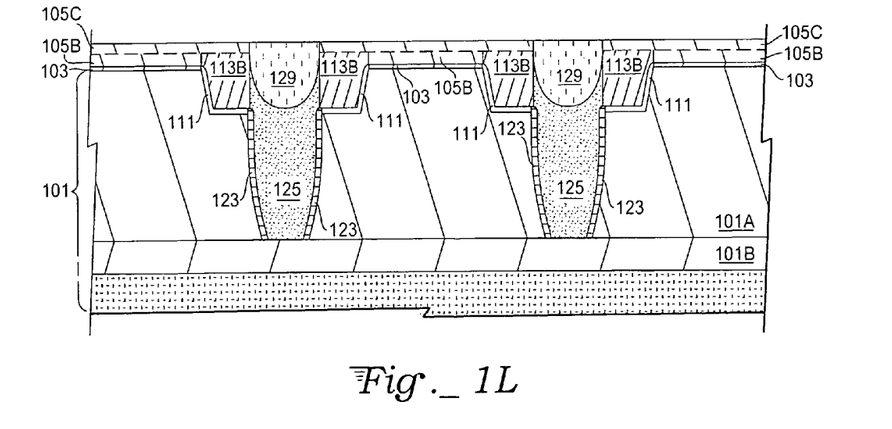
Figure 1M:
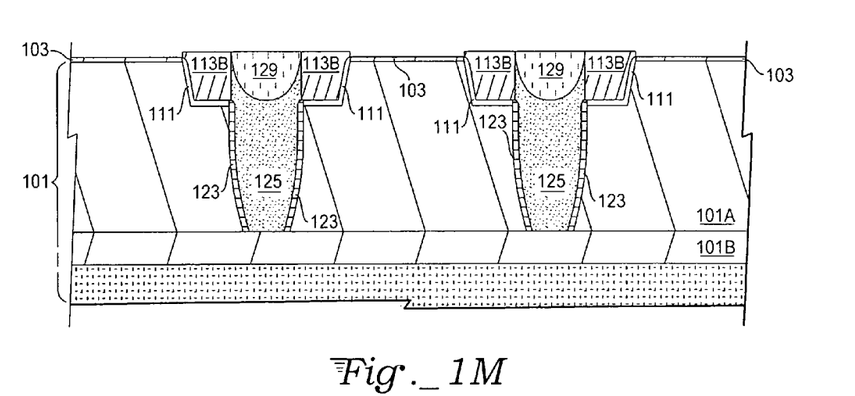

In FIG. 1K, a fourth oxide fill layer 129 is conformally deposited, followed by an additional CMP operation (FIG. 1L). The second silicon nitride layer 105C serves as a planarization stop point for the CMP operation. The silicon nitride layers 105B, 105C are selectively stripped (FIG. 1M) using, for example, hot phosphoric acid. Nitride may also be anisotropically etched, for example, by RIE.

Notice that an uppermost portion of exposed planarized first oxide layer 113B and the fourth oxide fill layer 129 are fairly continuous; there are no gaps between the two oxide regions. Although a silicon nitride etchant used in FIG. 1M partially etches a portion of the fourth oxide fill layer 129, the upper portion of the fourth oxide fill layer 129 may not be perfectly coplanar with an upper portion of the planarized first silicon oxide layer 113B. However, any vertical step that may be created between the similar dielectric materials is typically rounded or beveled. Thus, polysilicon stringers are not formed.

Further processing after this point, for example, polysilicon deposition steps to form active devices (e.g., MOSFETs), is simplified if underlying layers have no inaccessible vertical steps or gaps. Vertical steps or gaps can lead to formation of polysilicon stringers. Polysilicon stringers are thin conductive "strings" of polysilicon left along any steps or gaps on an uppermost surface topography after etching operations. These stringers occur because the thickness of the polysilicon film is much thicker at a step or gap than in flat areas, by approximately the step height plus the polysilicon thickness. Overetching the polysilicon film to eliminate stringers is undesirable since required conductive features may also be etched away. Therefore, steps or gaps should be avoided.

Figure 2A:
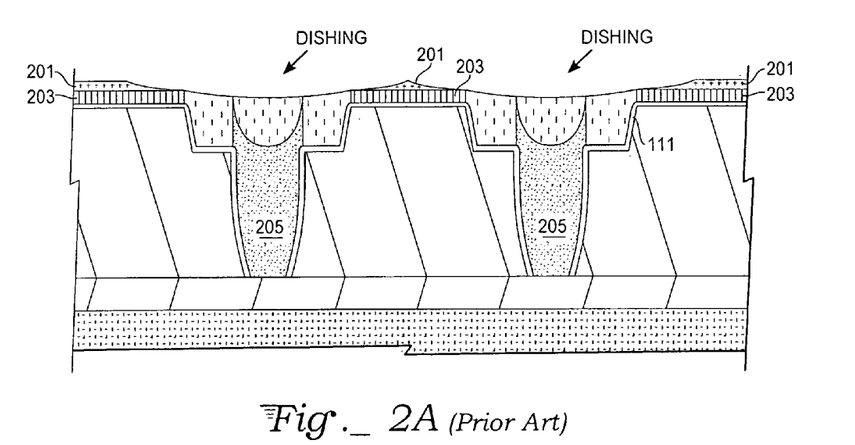
FIGS. 2A-2B show various steps in fabricating a deep trench isolation structure of the prior art.

FIG. 2A illustrates how such steps or gaps are commonly formed in the prior art. FIG. 2A includes an HDP oxide cap layer 201, a silicon nitride layer 203, and a deep trench oxide fill layer 205. Comparison of the prior art with the present invention graphically illustrates an advantageous feature of the second silicon nitride layer 105C (FIG. 1L) of the present invention. When CMP is attempted without the silicon nitride layer 105C, significant dishing of the dielectric layer takes place. Dishing is a feature common to CMP operations and occurs due to a difference in relative hardness levels of various planarized materials. Silicon nitride is much harder (e.g., on a Mhos or Rockwell-C hardness scale) than silicon dioxide. Consequently, the oxide wears more quickly than the nitride and dishing results. The dishing causes exposure of the junction between the dielectric layers and disparate physical characteristics and disparate etch rates during subsequent etch and clean operations.

Figure 2B:
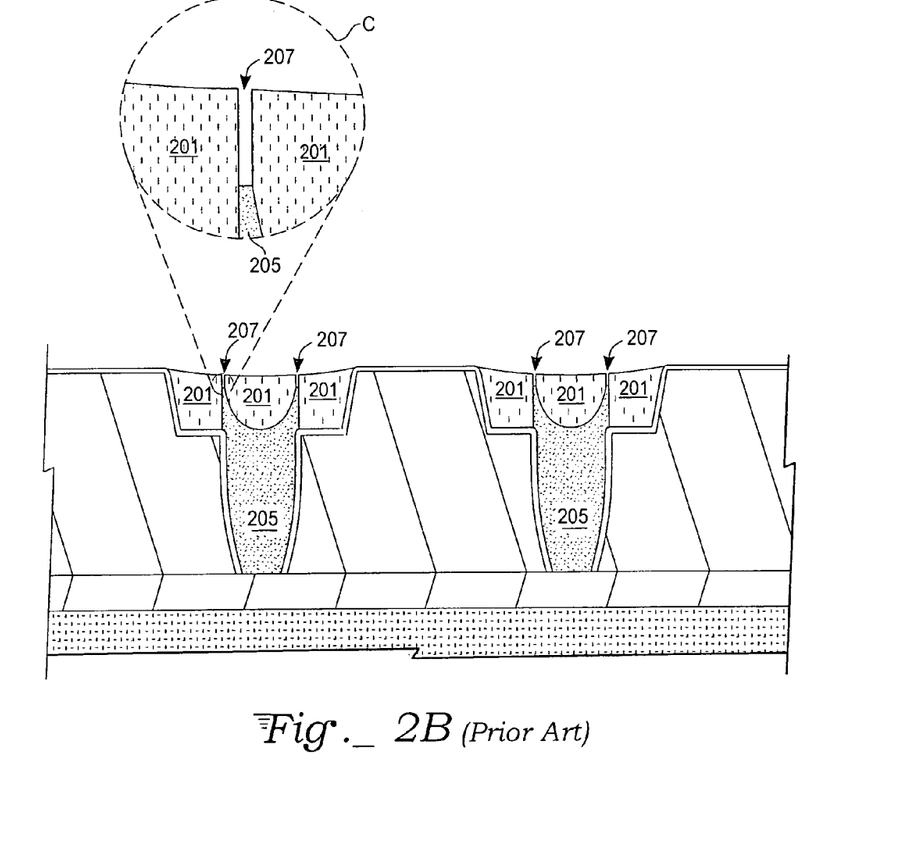

Also, deposition methods may produce a different effect in hardness and chemical characteristics of the same material. Therefore, an LPTEOS oxide will have a different etch rate from an HDP oxide. During subsequent processing, a junction of these differently deposited materials will form a vertical step which later causes a polysilicon stringer to form. Prior art processing of isolation regions of FIG. 2B illustrates this point. Wet etches (e.g., hot phosphoric acid to remove nitride and BOE to remove oxide) cause exposure of the junction between different oxide types, resulting in formation of a vertical step 207, see especially area "C." The etch rate of the LPTEOS oxide (i.e., the deep trench oxide fill layer 205) used to fill the deep trench is typically higher that that of the HDP cap layer 201. Conversely, an etch rate of the capping dielectric could be higher that that of the fill material for the deep trench. In either case, a vertical step forms. The vertical step 207 allows a subsequently deposited polysilicon layer (not shown) to be deposited more thickly in the vertical step 207 area, leaving a potential for polysilicon stringers. The polysilicon stringer causes shorts between parallel polysilicon conductors, thereby destroying the functionality of one or more IC components. The present invention eliminates or minimizes the possibility of a vertical step being formed.

To facilitate an understanding of the present invention, a process and arrangement for partially forming a MOSFET device has been discussed herein. However, the inventive processes and arrangements of layers and regions described herein are also useful for forming isolation regions for a wide range of other device types and structures having utility as individual devices or in combinations.

For example, many industries allied with the semiconductor industry could make use of this technique. For example, a thin-film head (TFH) process in the data storage industry or an active matrix liquid crystal display (AMLCD) in the flat panel display industry could readily make use of the isolation processes and techniques described herein. The term "semiconductor" should be recognized as including at least the aforementioned as well as other related industries.

Additionally, although process steps and techniques are shown and described in detail, a skilled artisan will recognize that other techniques and methods may be utilized which are still included within a scope of the appended claims. For example, there are frequently several techniques used for depositing a film layer (e.g., chemical vapor deposition, plasma-enhanced vapor deposition, atomic layer deposition, etc.). Although not all techniques are amenable to all film types described herein, one skilled in the art will recognize that multiple methods for depositing a given layer and/or film type may be used.

What is claimed is:

1. A method of fabricating an electrical isolation device, the method comprising:

forming a first dielectric layer on a first surface of a substrate;

forming a second dielectric layer over the first dielectric layer, the second dielectric layer being comprised of a substantially harder material than the first dielectric layer;

etching though a portion of the first and second dielectric layers, thereby exposing a portion of the first surface of the substrate;

etching a shallow trench into the substrate in a region substantially circumscribed by the exposed portion of the first surface of the substrate, the shallow trench having exposed sidewalls and a bottom region, the bottom region being substantially parallel with the first surface;

depositing a third dielectric layer, the third dielectric layer filling the shallow trench and covering at least a portion of the second dielectric layer;

planarizing the third dielectric layer to a level substantially coplanar with an uppermost surface of the second dielectric layer;

forming a fourth dielectric layer over the second dielectric layer and the planarized third dielectric layer, the fourth dielectric layer being comprised of a material having a comparable hardness value as the second dielectric layer;

etching through the third and fourth dielectric layers in a region substantially circumscribed laterally by the shallow trench;

etching into the substrate in the region substantially circumscribed laterally by the shallow trench, the step of etching into the substrate thereby forming a deep trench in the substrate; and depositing a fifth dielectric layer, the fifth dielectric layer filling the deep trench and covering at least a portion of the fourth dielectric layer.

2. The method of claim 1 further comprising forming a thermally grown dielectric layer on the exposed sidewalls and bottom region of the shallow trench prior to conformally depositing the third dielectric layer.

3. The method of claim 1 further comprising forming a thermally grown dielectric layer on any exposed areas of the deep trench prior to depositing the fifth dielectric layer.

4. The method of claim 1 further comprising etching partially into the fifth dielectric fill layer in a region substantially circumscribed laterally by the deep trench and filling the partially etched area of the deep trench with a sixth dielectric layer, the sixth dielectric layer being comprised of a material having better electrical performance characteristics than material comprising the fifth dielectric layer.

5. The method of claim 4, wherein the fifth and sixth dielectric layers are each substantially comprised of silicon dioxide.

6. The method of claim 4 further comprising planarizing the fifth dielectric layer to a level substantially coplanar with an uppermost portion of the fourth dielectric layer.

7. The method of claim 6 further comprising etching substantially all remaining portions of the fourth dielectric layer.

8. The method of claim 1, wherein the substrate is a silicon-on-insulator (SOI) wafer comprising a substrate, an insulator layer, and a silicon cap layer.

9. The method of claim 8, wherein the deep trench is etched to a level of an uppermost portion of the insulator in the SOI wafer.

10. The method of claim 1, wherein the substrate contains a buried oxide layer.

11. The method of claim 10, wherein the deep trench is etched to a level of an uppermost portion of the buried oxide layer in the substrate.

12. The method of claim 1, wherein the first, third, and fifth dielectric layers are each substantially comprised of silicon dioxide.

13. The method of claim 1, wherein the second and fourth dielectric layers are each substantially comprised of silicon nitride.

14. A method of fabricating an electrical isolation device, the method comprising:

forming a first silicon dioxide layer on a first surface of a substrate;

forming a first silicon nitride layer over the first silicon dioxide layer;

etching through a portion of the first silicon dioxide layer and the first silicon nitride layer, thereby exposing a portion of the first surface of the substrate;

etching a shallow trench into the substrate in a region substantially circumscribed by the exposed portion of the first surface of the substrate, the shallow trench having exposed sidewalls and a bottom region, the bottom region being substantially parallel with the first surface;

depositing a second silicon dioxide layer thereby filling the shallow trench and covering at least a portion of the first silicon nitride layer;

planarizing the second silicon dioxide layer to a level substantially coplanar with an uppermost surface of the first silicon nitride layer;

forming a second silicon nitride layer over the planarized second silicon dioxide layer and the first silicon nitride layer;

etching through the second silicon dioxide layer and the second silicon nitride layer in a region substantially circumscribed laterally by the shallow trench;

etching a deep trench into the substrate in the region substantially circumscribed laterally by the shallow trench; and depositing a third silicon dioxide layer, the third silicon dioxide layer filling the deep trench and covering at least a portion of the second silicon nitride layer.

15. The method of claim 14 further comprising planarizing the third silicon dioxide layer to a level substantially coplanar with an uppermost portion of the second silicon nitride layer.

16. The method of claim 14 further comprising forming a thermally grown dielectric layer on the exposed sidewalls and bottom region of the shallow trench prior to conformally depositing the second silicon dioxide layer.

17. The method of claim 14 further comprising forming a thermally grown silicon dioxide layer on any exposed areas of the deep trench prior to depositing the third silicon dioxide layer.

18. The method of claim 14 further comprising etching partially into the third silicon dioxide layer in a region substantially circumscribed laterally by the deep trench and filling the partially etched area of the deep trench with a fourth silicon dioxide layer, the fourth silicon dioxide layer being comprised of a material having better electrical performance characteristics than material comprising the third silicon dioxide layer.

19. The method of claim 18 further comprising planarizing the third silicon dioxide layer to a level substantially coplanar with an uppermost portion of the second silicon nitride layer.

20. The method of claim 19 further comprising etching substantially all remaining portions of the second silicon nitride layer.

21. The method of claim 14, wherein the substrate is a silicon-on-insulator (SOI) wafer comprising a substrate, an insulator layer, and a silicon cap layer.

22. The method of claim 21, wherein the deep trench is etched to a level of an uppermost portion of the insulator in the SOI wafer.

23. The method of claim 14, wherein the substrate contains a buried oxide layer.

24. The method of claim 23, wherein the deep trench is etched to a level of an uppermost portion of the buried oxide layer in the substrate.

25. The method of claim 14, wherein the substrate is a wafer formed from intrinsic silicon.

* * * * *

UNITED STATES PATENT AND TRADEMARK OFFICE
CERTIFICATE OF CORRECTION

PATENT NO. : 7,435,661 B2  Page 1 of 1
APPLICATION NO. : 11/341010
DATED : October 14, 2008
INVENTOR(S) : Miller et al.

It is certified that error appears in the above-identified patent and that said Letters Patent is hereby corrected as shown below:

In column 7, line 7, in Claim 1, delete "though" and insert -- through --, therefor.

Signed and Sealed this

Twenty-seventh Day of January, 2009

JOHN DOLL
*Acting Director of the United States Patent and Trademark Office*